United States Patent
Lin et al.

(10) Patent No.: US 8,067,283 B2
(45) Date of Patent: Nov. 29, 2011

(54) SEMICONDUCTOR DEVICE FABRICATING METHOD

(75) Inventors: Chih-Ping Lin, Taipei County (TW); Shih-Ming Chen, Hsinchu (TW); Hsiao-Ying Yang, Hsinchu (TW); Wen-Hsien Liu, Taoyuan County (TW); Po-Sheng Hu, Taipei County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 12/618,585

(22) Filed: Nov. 13, 2009

(65) Prior Publication Data
US 2011/0117709 A1    May 19, 2011

(51) Int. Cl.
*H01L 21/8238*    (2006.01)
(52) U.S. Cl. .......... 438/231; 257/E21.634; 257/E21.639
(58) Field of Classification Search ........... 438/231
See application file for complete search history.

(56) References Cited

U.S. PATENT DOCUMENTS

| | | | | |
|---|---|---|---|---|
| 6,033,943 A | * | 3/2000 | Gardner | 438/199 |
| 6,168,958 B1 | * | 1/2001 | Gardner et al. | 438/3 |
| 6,261,978 B1 | * | 7/2001 | Chen et al. | 438/224 |
| 2005/0059195 A1 | * | 3/2005 | Curro | 438/197 |

* cited by examiner

*Primary Examiner* — N Drew Richards
*Assistant Examiner* — Robert Carpenter

(57) ABSTRACT

A semiconductor device fabricating method is described. The semiconductor device fabricating method includes providing a substrate. A first gate insulating layer and a second gate insulating layer are formed on the substrate, respectively. A gate layer is blanketly formed. A portion of the gate layer, the first gate insulating layer and the second gate insulating layer are removed to form a first gate, a remaining first gate insulating layer, a second gate and a remaining second gate insulating layer. The remaining first gate insulating layer not covered by the first gate has a first thickness, and the remaining second gate insulating layer not covered by the second gate has a second thickness, wherein a ratio between the first thickness and the second thickness is about 10 to 20. A pair of first spacers and a pair of second spacers are formed on sidewalls of the first gate and the second gate, respectively.

9 Claims, 3 Drawing Sheets

US 8,067,283 B2

SEMICONDUCTOR DEVICE FABRICATING METHOD

BACKGROUND OF THE INVENTION

1. Field of the Invention

The invention relates to a semiconductor device fabricating method, and more particularly to a semiconductor device fabricating method of integrating different devices having different gate insulating layer thicknesses.

2. Description of the Related Art

System-on-a-chip (SoC) designs have become mainstream designs of integrated circuits due to improving semiconductor device scaling processes and critical requirements for dimensions and functions of consumer products. System-on-a-chip (SoC) technology, incorporates all necessary electronic devices and circuitry together, such as, logic devices, memory devices or input/output (I/O) interfaces, for a complete "system" on a single integrated circuit (IC). For example, an SoC fabricating process of a liquid crystal display (LCD) is needed for integrating high voltage (such as, 30 or 40 V) metal oxide semiconductor transistors (HVMOS), low voltage or medium voltage (such as, 2.5 or 5V) logic circuits, or non-volatile memory devices in one chip. Gate insulating layers for SoC devices may have different thicknesses and obvious thickness differences. In the conventional semiconductor fabrication processes, an etching process can be used to remove the remaining gate insulating layers which are not covered by the gates of different devices with different thicknesses after the gate formation step. However, following the conventional etching process steps, undesired substrate loss or gate defect problem due to extreme thickness differences among the gate insulating layers of the different devices, may occur. Therefore, negatively effecting device performances and reliability. Meanwhile, the remaining gate insulating layers of different devices can be respectively removed using additional photolithography and etching processes. However, fabrication costs would increase due to an increase in the number of masks used for the additional photolithography and etching processes.

Therefore, improving device performance and reliability through process integration of different devices having different gate insulating layer thicknesses, such as, high voltage devices, low voltage or medium voltage devices, has become an important challenge.

A novel semiconductor device fabricating method integrating different devices is desirable.

BRIEF SUMMARY OF INVENTION

The invention provides a semiconductor device fabricating method. An exemplary embodiment of a method for fabricating a semiconductor device comprises providing a substrate having a first device region and a second device region. A first gate insulating layer and a second gate insulating layer are then formed in the first device region and the second device region, respectively. Next, a gate layer is blanketly formed. The gate layer is then patterned by removing a portion of the first gate insulating layer and the second gate insulating layer to form a first gate and a remaining first gate insulating layer in the first device region, and form a second gate and a remaining second gate insulating layer in the second device region. The remaining first gate insulating layer not covered by the first gate has a first thickness, and the remaining second gate insulating layer not covered by the second gate has a second thickness. Next, a pair of first spacers and a pair of second spacers are respectively formed on sidewalls of the first gate and the second gate, wherein the first spacers cover a portion of the remaining first gate insulating layer, and the second spacers cover a portion of the remaining second gate insulating layer.

Another exemplary embodiment of a method for fabricating a semiconductor device comprises providing a substrate having a first device region and a second device region. A first gate insulating layer and a second gate insulating layer are then formed in the first device region and the second device region, respectively. Next, a gate layer is blanketly formed. The gate layer is then patterned by removing a portion of the first gate insulating layer and the second gate insulating layer to form a first gate and a remaining first gate insulating layer in the first device region, and form a second gate and a remaining second gate insulating layer in the second device region. The remaining first gate insulating layer not covered by the first gate has a first thickness, and the remaining second gate insulating layer not covered by the second gate has a second thickness. A spacer insulating layer having a third thickness is then blanketly formed. Next, an anisotropic etching process is performed to remove a portion of the spacer insulating layer, a portion of the remaining first gate insulating layer and a portion of the remaining second gate insulating layer until the first gate and the second gate are exposed. Finally, a pair of first spacers and a pair of second spacers are respectively formed on sidewalls of the first gate and the second gate, wherein the first spacers cover a portion of the remaining first gate insulating layer, and the second spacers cover a portion of the remaining second gate insulating layer.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
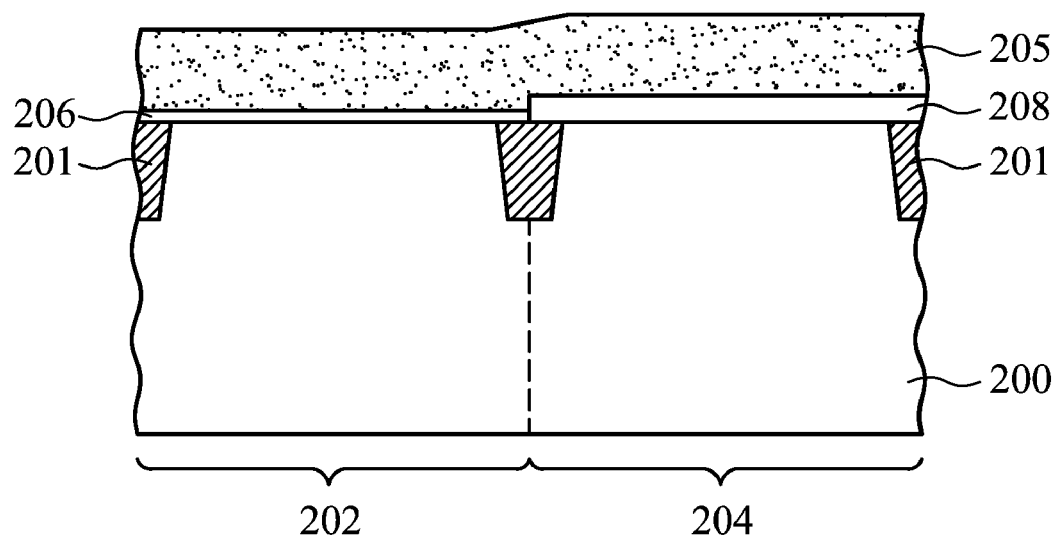
FIGS. 1 to 5 show cross sections of an exemplary embodiment of a semiconductor device of the invention.

The following description is of a mode of carrying out the invention. This description is made for the purpose of illustrating the general principles of the invention and should not be taken in a limiting sense. The scope of the invention is best determined by reference to the appended claims.

FIGS. 1 to 5 show cross sections of an exemplary embodiment of a semiconductor device of the invention. Whenever possible, the same reference numbers are used in the drawings and the descriptions of the same or like parts.

FIG. 1 illustrates a cross section of an exemplary embodiment of a semiconductor device of the invention. A substrate 200 is provided. The substrate 200 may comprise silicon. In alternative embodiments, SiGe, bulk semiconductor, strained semiconductor, compound semiconductor, silicon on insulator (SOI), and other commonly used semiconductor substrates can be used for the substrate 200. The substrate 200 may have a desired conductive type by implanting P-type or N-type impurities. A plurality of shallow trench isolations (STIs) 201 may be formed in the substrate 200 to define two regions, a first device region 202 and a second device region 204. The shallow trench isolations (STIs) may be formed by etching the substrate 200 to form recesses. Next, a dielectric material such as a high-density plasma oxide (HDP oxide) is filled in the recesses. A planarization process such as a chemical mechanical polish (CMP) process is performed for removing the excessive dielectric material to form STIs 201 in the substrate 200. The STIs 201 are formed extending from a surface of the substrate 200 into an interior of the substrate 200. The STIs 201 are formed adjacent to the first device region 202 and the second device region 204. The first device region 202 is electrically isolated from the second device region 204 by the STIs 201. In one embodiment, the first device region 202 and the second device region 204 are regions providing various device formations, respectively. For example, the first device region 202 may serve as a low voltage device region 202 for logic devices or memory device formations. The second device region 204 may serve as a high voltage device region 204 for formation of driver ICs or the like. Alternatively, the first device region 202 may serve as a region used for digital device formations. The second device region 204 may serve as a region used for analog device formations.

Next, a first gate insulating layer 206 and a second gate insulating layer 208 may be formed in the first device region 202 and the second device region 204, respectively. The first gate insulating layer 206 and the second gate insulating layer 208 may respectively cover the first device region 202 and the second device region 204 of the substrate 200. A thickness of the first gate insulating layer 206 and a thickness of the second gate insulating layer 208 may have a ratio of about 1:10 to 1:20. In one embodiment, the first gate insulating layer 206 and the second gate insulating layer 208 may be formed in different process steps. The first gate insulating layer 206 and the second gate insulating layer 208 may be formed by a thin film deposition process, such as, a thermal oxidation, chemical vapor deposition (CVD), and atomic layer CVD (ALD) process or the like. The first gate insulating layer 206 and the second gate insulating layer 208 may comprise commonly used dielectric materials, such as, oxide, nitride, oxynitride, and oxycarbide materials or combinations thereof. Also, the first gate insulating layer 206 and the second gate insulating layer 208 may comprise high-k (k>8) dielectric materials, such as, aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate, $ZrSiO_4$) yttrium oxide ($Y_2O_3$), lanthalum oxide ($La_2O_3$), cerium oxide ($CeO_2$), and titanium oxide ($TiO_2$) materials or combinations thereof. Next, a gate layer 205 may be blanketly formed covering the first gate insulating layer 206 and the second gate insulating layer 208. In one embodiment, the gate layer 205 may be formed by a thin film deposition process, such as, a chemical vapor deposition (CVD) process or the like. The gate layer 205 may comprise a conductive layer comprising silicon or polysilicon. Preferably, the gate layer 205 may be formed by doping impurities to reduce sheet resistance thereof. Alternatively, the gate layer 205 may comprise amorphous silicon.

Figure 2:
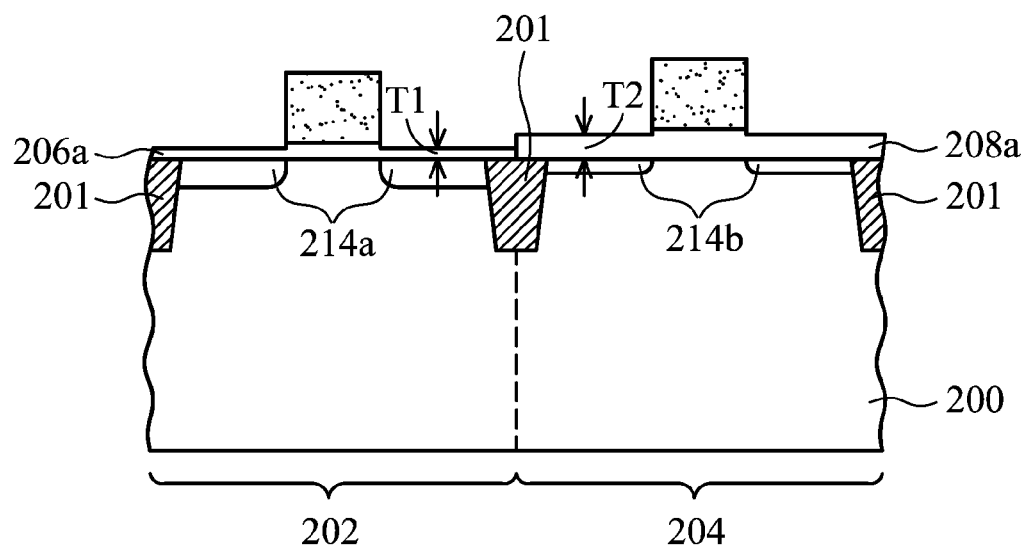

Referring to FIG. 2, a patterned photo resist layer (not shown) may respectively be formed on the gate layer 205 in the first device region 202 and the second device region 204, defining formation positions of a subsequence first and second gates 210 and 212. A portion of the first and second gate insulating layer 206 and 208 and the gate layer 205, which are not covered by the patterned photo resist layer, are removed by a process, such as, an anisotropic etching process, to form a remaining first gate insulating layer 206a and a first gate 210 in the first device region 202, and a remaining second gate insulating layer 208a and a second gate 212 in the second device region 204. Next, the patterned photo resist layer respectively formed in the first device region 202 and the second device region 204 is removed. In one embodiment, the first gate 210 and the second gate 212 may be formed in different process steps. The remaining first gate insulating layer 206a and the remaining second gate insulating layer 208a may comprise the same materials. The remaining first gate insulating layer 206a not covered by the first gate 210 may have a thickness $T_1$, and the remaining second gate insulating layer 208a not covered by the second gate 212 may have a thickness $T_2$. The thickness $T_1$ is thinner than a thickness of the remaining first gate insulating layer 206a covered by the first gate 210, and the thickness $T_2$ is thinner than a thickness of the remaining second gate insulating layer 208a covered by the second gate 212. In one embodiment, the thickness $T_2$ may be thicker than the thickness $T_1$. For example, the thickness $T_1$ and the thickness $T_2$ may have a ratio of about 1:5 to 1:20.

Next, an implantation process may be performed using the first gate 210 and the second gate 212 as masks to form first lightly source/drain regions 214a and second lightly source/drain regions 214b in a portion of the substrate 200 of the first device region 202 and the second device region 204, respectively. The first lightly source/drain regions 214a and the second lightly source/drain regions 214b are formed adjacently in the substrate 200 and on opposite sides of the first gate 210 and the second gate 212, respectively.

Figure 3:
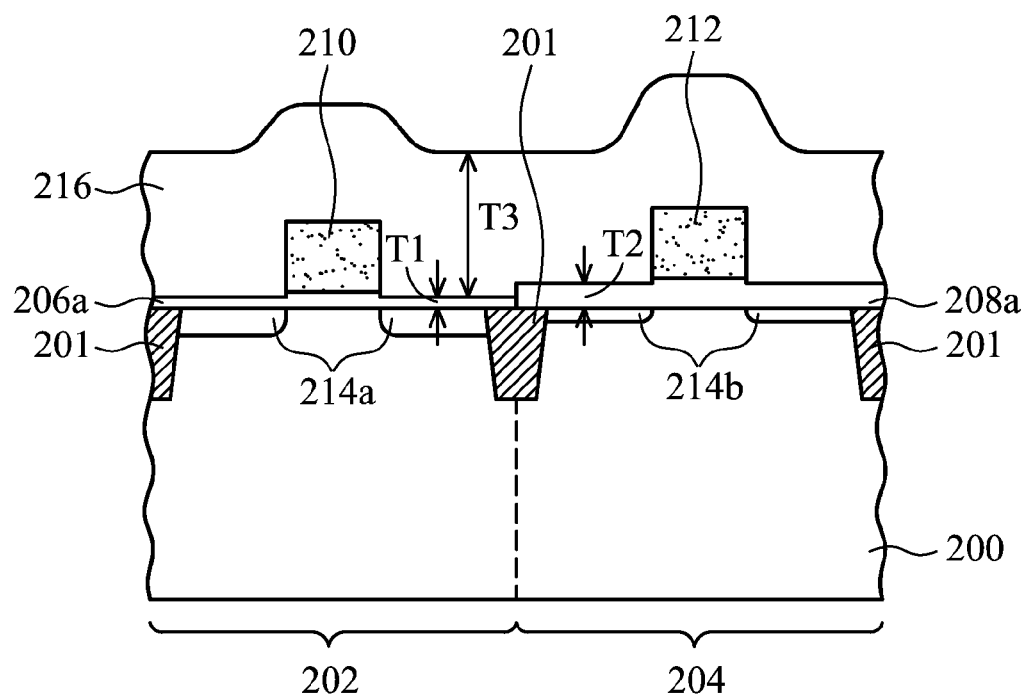

As shown in FIG. 3, a spacer insulating layer 216 is blanketly formed, covering the first gate 210, the second gate 212, the remaining first gate insulating layer 206a and the remaining second gate insulating layer 208a. The spacer insulating layer 216 may comprise oxide, nitride, oxynitride, and oxycarbide or combinations thereof. In one embodiment, the spacer insulating layer 216 may have a thickness $T_3$ much thicker than the thickness $T_1$ and the thickness $T_2$. For example, the thickness $T_3$ may be between 1000 Å to 7000 Å. Alternatively, the thickness $T_3$ and the thickness $T_1$ may have a ratio of about 10:1 to 25:1. The thickness $T_3$ and the thickness $T_2$ may have a ratio of about 2:1 to 10:1. As shown in FIG. 3, the thickness $T_3$ may be properly controlled to enable a slight thickness difference between a total thickness of the insulating layers over the substrate 200 in the first device region 202 without being covered by the first gate 210 and a total thickness of the insulating layers over the substrate 200 in the second device region 204 without being covered by the second gate 212. For example, a thickness difference between a total thickness of the thickness $T_1$ and thickness $T_3$ and a total thickness of the thickness $T_2$ and thickness $T_3$ is smaller than 600 Å.

Figure 4:
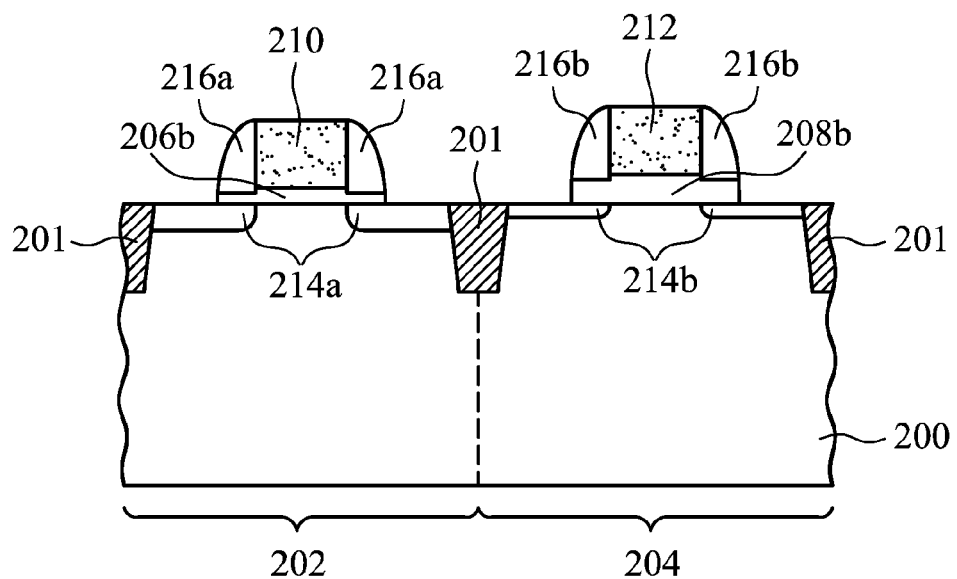

As shown in FIG. 4, an anisotropic etching process may be then performed to respectively remove a portion of the spacer insulating layer 216 and a portion of the remaining first gate insulating layer 206a in the first device region 202 and a portion of the spacer insulating layer 216 and a portion of the remaining second gate insulating layer 208a in the second device region 204 until the first gate 210 and the second gate 212 are exposed. Therefore, a pair of first spacers 216a and a pair of second spacers 216b are respectively formed on sidewalls of the first gate 210 and the second gate 212. A patterned first gate insulating layer 206b and a patterned second gate insulating layer 208b are also formed to expose a portion of the substrate 200. As shown in FIG. 4, the first spacers 216a cover a portion of the patterned first gate insulating layer 206b, and the second spacers 216b cover a portion of the patterned second gate insulating layer 208b. The total thickness of the insulating layers over the substrate 200 in the first device region 202 without being covered by the first gate 210 is thinner than the total thickness of the insulating layers over the substrate 200 in the second device region 204 without being covered by the second gate 212. Also, the total thickness of the insulating layers over the substrate 200 in the first device region 202 without being covered by the first gate 210 and the total thickness of the insulating layers over the substrate 200 in the second device region 204 without being covered by the second gate 212 have a small thickness difference, such as, smaller than 600 Å. During an anisotropic etching process for forming the first spacers 216a, the second spacers 216b, the patterned first gate insulating layer 206b and the patterned second gate insulating layer 208b, the substrate 200, which is not covered by the first gate 210 and the first spacers 216a, in the first device region 202 may be partially removed. Therefore, a surface of the resulting substrate 200 in the first device region 202 may be lower than that in the second device region 204 with a thickness between 0 Å to 500 Å. The aforementioned surface loss of the substrate 200 in the first device region 202 is small. Therefore, not hindering device performance.

Figure 5:
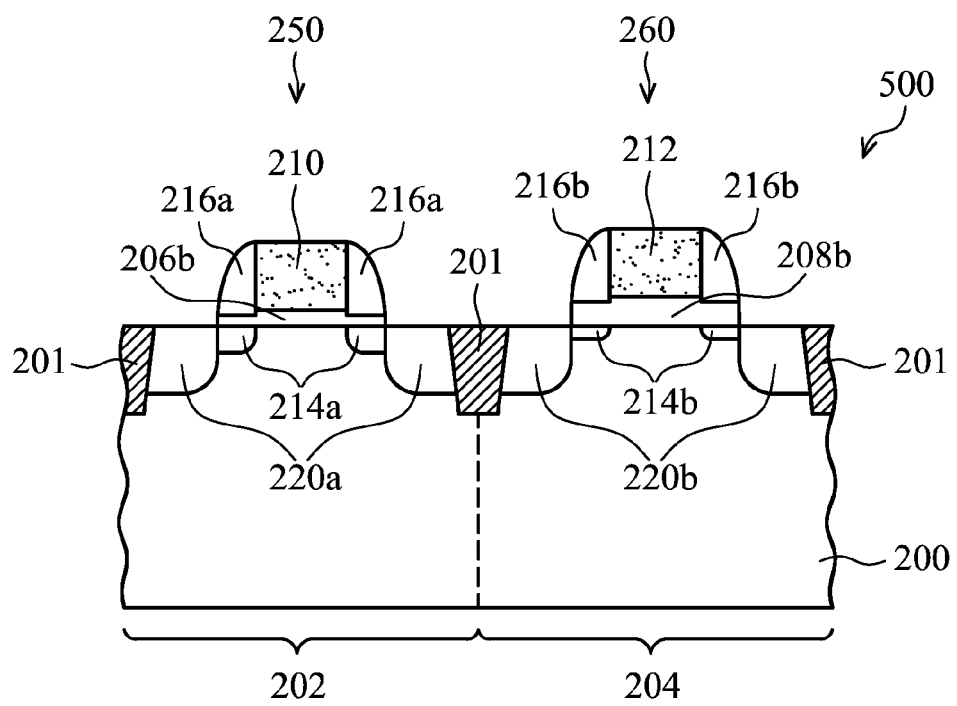

As shown in FIG. 5, an implantation process may be then performed to respectively form first heavily doped source/drain regions 220a and second heavily doped source/drain regions 220b in a portion of the substrate 200 of the first device region 202 and the second device region 204 using the first gate 210, the first spacers 216a, the second gate 212 and the second spacers 216b as masks. Therefore, a first device 250 and a second device 260 are formed in the first device region 202 and the second device region 204, respectively. The first device 250 may comprise the patterned first gate insulating layer 206b, the first gate 210, the first spacers 216a, the first lightly source/drain regions 214a and the first heavily doped source/drain regions 220a. The second device 260 may comprise the patterned second gate insulating layer 208b, the second gate 212, the second spacers 216b, the second lightly source/drain regions 214b and the second heavily doped source/drain regions 220b. The first heavily doped source/drain regions 220a and the second heavily doped source/drain regions 220b are adjacently formed outside of the first spacers 216a and the second spacers 216b, respectively. In one embodiment, the first heavily doped source/drain regions 220a and the second heavily doped source/drain regions 220b may be formed in different process steps. Therefore, completely forming an exemplary embodiment of a semiconductor device 500 of the invention. In one embodiment of the invention, the semiconductor device 500 may be formed by integrating the first device 250 comprising low voltage devices, such as, logic and memory devices, or digital device, and the second device 260 comprising high voltage devices, such as, BCD transistors, driver integrated circuit devices, or analog devices.

In one embodiment of the invention, the semiconductor device 500 may comprises the first device 250 and the second device 260 of different types. The semiconductor device 500 may be a device for integrating low/high voltage devices or digital/analog devices. In the semiconductor device 500, the first device 250 and the second device 260 may have obvious thickness differences between their gate insulating layers and can not be ignored. The gate insulating layer thicknesses of the first device 250 and the second device 260 may have a ratio of about 1:10 to 1:20. The fabricating method of the semiconductor device 500 may comprise respectively forming the first and second gates in the first and second device regions. The first and second lightly doped source/drain regions are then formed in the first and second device regions using the first and second gates as masks. Next, a spacer insulating layer having a thickness much thicker than those of the first and second gate insulating layers of the first device and the second device would cover the first and second gates. The spacer insulating layer can reduce thickness differences between the first and second insulating layers, which are not covered by the first and second gates, over the substrate in the first and second device regions. An anisotropic etching process for spacer formation is then performed to remove a portion of the spacer insulating layer and the entire remaining first and second gate insulating layers in the first and second device regions. Compared with the conventional processes, the fabricating method of the semiconductor device 500 may integrate different devices having different gate insulating layers thicknesses in one chip. The substrate loss or gate defect problem due to the conventional gate formation step having an etching process to remove the entire remaining gate insulating layers of different devices not covered by the gates, can be avoided. Therefore, device performances and reliability can be improved. The number of masks used in the fabrication process and the fabrication cost can be reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor device, comprising:
   providing a substrate having a first device region and a second device region;
   forming a first gate insulating layer and a second gate insulating layer in the first device region and the second device region, respectively;
   blanketly forming a gate layer;
   patterning the gate layer by removing a portion of the first gate insulating layer and the second gate insulating layer to form a first gate and a remaining first gate insulating layer in the first device region, and form a second gate and a remaining second gate insulating layer in the second device region, wherein the remaining first gate insulating layer not covered by the first gate has a first thickness, and the remaining second gate insulating layer not covered by the second gate has a second thickness;
   blanketly forming a spacer insulating layer having a third thickness; and
   performing an anisotropic etching process to remove a portion of the spacer insulating layer, a portion of the remaining first gate insulating layer, and a portion of the remaining second gate insulating layer, such that tops of the first gate and the second gate are exposed, a pair of first spacers and a pair of second spacers are left on sidewalls of the first gate and the second gate, and a portion of the substrate is exposed, wherein the anisotropic etching process is performed without masks shielding the first spacers and the second spacers;
   wherein the first spacers cover a portion of the remaining first gate insulating layer and the second spacers cover a portion of the remaining second gate insulating layer.

2. The method for fabricating the semiconductor device as claimed in claim 1, further comprising:
   forming a first lightly doped source/drain region and a second lightly doped source/drain region in a portion of the substrate on opposite sides of the first gate and the second gate, respectively; and
   forming a first heavily doped source/drain region and a second heavily doped source/drain region in a portion of the substrate outside of the first spacers and the second spacers, respectively.

3. The method for fabricating the semiconductor device as claimed in claim 2, wherein the first heavily doped source/drain region and the second heavily doped source/drain region are formed in different process steps.

4. The method for fabricating the semiconductor device as claimed in claim 1, wherein the third thickness and the first thickness have a ratio of 10:1 to 25:1.

5. The method for fabricating the semiconductor device as claimed in claim 1, wherein the third thickness and the second thickness have a ratio of 2:1 to 10:1.

6. The method for fabricating the semiconductor device as claimed in claim 1, wherein the first gate insulating layer and the second gate insulating layer are formed in different process steps.

7. The method for fabricating the semiconductor device as claimed in claim 1, wherein the first thickness is thinner than a thickness of the remaining first gate insulating layer covered by the first gate.

8. The method for fabricating the semiconductor device as claimed in claim 1, wherein the second thickness is thinner than a thickness of the remaining second gate insulating layer covered by the second gate.

9. The method for fabricating the semiconductor device as claimed in claim 1, wherein the first thickness and the second thickness have a ratio of 1:5 to 1:20.

* * * * *